(12) United States Patent
Leo et al.

(10) Patent No.: US 7,061,160 B2
(45) Date of Patent: Jun. 13, 2006

(54) ASSEMBLY HAVING A COMPONENT ENCLOSED BY A HOUSING, AND DEVICE AND METHOD USED IN ITS MANUFACTURE

(75) Inventors: Kristian Leo, Burgstetten (DE); Michael Jupe, Ludwigsburg (DE); Peter Sprafke, Stuttgart (DE); Markus Muzic, Murr (DE); Wolfgang Endres, Remshalden (DE)

(73) Assignee: Robert Bosch GmbH, Stuttgart (DE)

( * ) Notice: Subject to any disclaimer, the term of this patent is extended or adjusted under 35 U.S.C. 154(b) by 253 days.

(21) Appl. No.: 10/190,656

(22) Filed: Jul. 8, 2002

(65) Prior Publication Data
US 2003/0085634 A1 May 8, 2003

(30) Foreign Application Priority Data
Jul. 7, 2001 (DE) .............................. 101 33 151

(51) Int. Cl.
*H01L 41/04* (2006.01)
*H02N 2/00* (2006.01)

(52) U.S. Cl. ...................... 310/328; 310/311
(58) Field of Classification Search ............... 310/340, 310/345, 346, 328, 325; 174/52.2
See application file for complete search history.

(56) References Cited

U.S. PATENT DOCUMENTS

| | | | |
|---|---|---|---|
| 4,869,954 A * | 9/1989 | Squitieri ...................... 442/13 |
| 5,218,259 A | 6/1993 | Dam et al. ................... 310/328 |
| 5,593,721 A * | 1/1997 | Daidai et al. ................ 427/100 |
| 6,051,783 A * | 4/2000 | Dreyer et al. ............... 174/52.2 |
| 6,281,436 B1 * | 8/2001 | Gotoh et al. ................ 174/52.3 |
| 6,344,706 B1 * | 2/2002 | Morita et al. ............... 310/340 |
| 6,784,598 B1 * | 8/2004 | Kaida ......................... 310/348 |

FOREIGN PATENT DOCUMENTS

| | | |
|---|---|---|
| DE | 2942258 | 5/1981 |
| DE | 4224122 | 1/1994 |
| DE | 198 18 068 | 10/1999 |
| DE | 20017105 | 2/2001 |

\* cited by examiner

*Primary Examiner*—Darren Schuberg
*Assistant Examiner*—J. Aguirrechea
(74) *Attorney, Agent, or Firm*—Kenyon & Kenyon LLP

(57) ABSTRACT

To provide an assembly which is as small as possible which contains a well-protected component and effectively dissipates heat, and to provide a device and a method for use in the rapid manufacture of such an assembly, an assembly includes a component and a housing from which the component is partially separated by narrow casting gaps filled with a casting compound containing a relatively large amount of filler. For the manufacture of such an assembly, a device is used for filling with casting compound and which includes a mounting for securing the assembly in a position which permits air to escape from the casting gaps, which have an external connection during filling. Also there are supply containers and supply lines for the casting compound which open into the casting gaps, and an apparatus for generating pressure. A method which is used to fill narrow casting gaps with casting compound by using such a device. The method involves introducing a casting compound of predetermined viscosity under pressure through the supply lines into the casting gaps, from which the air is displaced.

23 Claims, 4 Drawing Sheets

ASSEMBLY HAVING A COMPONENT ENCLOSED BY A HOUSING, AND DEVICE AND METHOD USED IN ITS MANUFACTURE

FIELD OF THE INVENTION

The present invention relates to an assembly which includes a component and a housing enclosing the component to which a region of the component is attached, this region is separated from other regions of the component by a casting gap filled with a crosslinked casting compound containing a filler, and to a device, and to a method which may be performed using such a device, for filling casting gaps with a casting compound in the manufacture of such an assembly.

BACKGROUND INFORMATION

Such assemblies are conventional. The housing and the casting compound protect the component from vibrations and moisture. Filling the casting gap is not difficult, because it may be made sufficiently wide and a casting compound with a relatively low viscosity may be used. With the increasing trend toward miniaturization, however, the referenced conventional assemblies no longer completely meet the demands imposed on them.

SUMMARY OF THE INVENTION

It is an object of the present invention to provide an assembly which takes up little space, which contains a component well-protected from mechanical damage and moisture, and which is able to effectively dissipate heat produced by the component, and to provide a device and a method for use in the reproducible and rapid manufacture of such an assembly.

In the present invention, the feature "a component which is enclosed by a housing" also includes cases in which the housing encloses more than one component, and in these cases, casting gaps filled or to be filled with casting compound also optionally include the gaps between the components. In the description which follows, the term "assembly" is used even when the casting gaps between the housing and the component have not yet been filled with casting compound.

The narrow width of the casting gaps in the assembly according to the present invention and the relatively high filler content in the casting compound which induces good heat conductivity assure that heat from the component is effectively dissipated. The narrow widths of the casting gaps also permit the assembly to be compactly configured. By combining the device according to the present invention and the method according to the present invention, it is possible not only to simultaneously satisfy the generally incompatible requirements that the cavity be narrow but it be filled with a casting compound containing a relatively large amount of filler, i.e., with a relatively viscous casting compound, but also to fill the cavity without air inclusions, i.e., in a reproducible manner, as well as to perform this in a period of time which is acceptable for industrial applications.

It may be advantageous if the filler content in the casting compound relative to the total weight of the casting compound is between approximately 20% and approximately 90% by weight, and even more advantageously, between approximately 50% and approximately 80% by weight, which corresponds to heat conductivities of the casting compound between approximately 0.3 and approximately 2 watt/m° K and between approximately 0.5 and approximately 1.3 watt/m° K, respectively.

It may be advantageous if the housing includes a tubular sleeve which surrounds the component and a base to which the component and the sleeve are attached. In this regard, it may be advantageous for the base to be inserted in one end of the tubular sleeve, the inserted end region of the base including a cross section which is matched to the tubular cross section so that the end region fits closely against the interior of the tube. It may be advantageous if the cured casting compound is elastic, due to the fact that a component which vibrates during operation, such as an actuator, e.g., a piezoelectric actuator, is then able to advantageously vibrate through the casting compound and the housing without damping. In this regard, it may be advantageous for the component to have an oblong shape and for its longitudinal axis to be perpendicular to the base. For example, an oblong piezoelectric actuator containing a plurality of layers perpendicular to the longitudinal axis, when energized, is able to create vibrations of higher amplitude than a shorter, thicker piezoelectric actuator manufactured from the same amount of material.

It may be advantageous if the smallest dimension across the casting gap between the sleeve surrounding the component and the component itself is between approximately 0.05 mm and approximately 0.2 mm, and the largest dimension is between approximately 1.4 mm and approximately 2.6 mm.

To fill casting gaps with the casting compound, it may be advantageous if at least one continuous borehole is introduced in the region of the sleeve in which the base is inserted, and the inserted region of the base provides for each borehole a transport path for a free-flowing medium between the surface region of the base facing toward the inner wall of the cylinder and the end of the base facing toward the interior of the tube, the transport paths running in such a manner that, as long as the sleeve is not firmly connected to the base, the sleeve and the base may be brought together in such a position that each of the at least one borehole opens into the transport path associated with it.

It may be advantageous if the casting compound contains resin components based on silicones, polyurethanes, and epoxide, and the filler is selected from a material from the group including silicon dioxide, aluminum oxide, titanium dioxide, boron nitride, aluminum nitride, and mixtures of these materials.

To fill the narrow casting gaps, the device according to the present invention may advantageously include at least one hollow needle for supply, optionally placed on a nozzle, which is connected to at least one supply container for the casting compound and which opens into the assembly, and which includes a circular cross section and an inner diameter between approximately 0.2 mm and approximately 2 mm.

In one example embodiment of the device, which for filling casting gaps may be advantageously insertable in the aforementioned assembly including a borehole in the sleeve, the at least one hollow needle is positioned in such a manner that it may be inserted into at least one continuous borehole in the housing of the attached assembly, the assembly is equipped so that a tubular sleeve and a base inserted in one end of the sleeve are included in the housing, that the at least one borehole is situated in the region of the sleeve of the housing in which the base is inserted, and that the inserted end region of the base provides for each borehole a transport path for a free-flowing medium between the surface region of the base facing toward the inner wall of the cylinder and the end of the base adjoining the casting gaps, and the sleeve and the base may be brought together in a position in which each borehole is connected to the transport path associated with it, and that the end facing away from the base is open during filling. It may be advantageous if the connection between the at least one borehole and the transport path associated with it is interruptible by displacing the sleeve and the base with respect to one another.

In another example embodiment of the device, the at least one hollow needle is inserted into the assembly through an opening in the housing and opens into a casting gap. It may be advantageous if the at least one hollow needle is displaceable in the casting gap(s) in the direction of filling and in the direction opposite to the direction of filling. During displacement it is favorable if guiding aids are present to displace the at least one hollow needle in the casting gap(s) without contacting the component and, when at least two hollow needles are present, to displace the hollow needles parallel to one another.

As an alternative to the hollow needles including a circular cross section, the hollow needles may also advantageously include a cross section which is adapted to the gap geometry perpendicular to the longitudinal axis of the casting gaps. Thus, a larger area of the casting gap cross section may be filled with the hollow needle cross section than is possible using a hollow needle including a circular cross section.

In order to rapidly and uniformly deliver the casting compound even in narrow regions of the casting gap, it may be advantageous in the method according to the present invention if the casting pressure is between approximately 0.5 bar and approximately 10 bar.

With regard to good dissipation of heat from the component, it may be advantageous in the method according to the present invention if a casting compound is used which has a viscosity between approximately 1000 mPas and approximately 50,000 mPas.

In the method according to the present invention, it may be advantageous if the casting compound is introduced into the assembly via at least one hollow needle, and the viscosity of the casting compound determines the smallest inner cross section of the hollow needle which is usable.

The present invention is described hereinafter in detail, with reference to the drawings which illustrate the example embodiments. In the following discussion the present invention is described, with reference to example embodiments of the assembly according to the present invention, of the method according to the present invention, and of the device according to the present invention. It is to be understood, however, that although the present invention may be explained in an illustrative manner with reference to these example embodiments, various departures from the example embodiments are allowed.

DETAILED DESCRIPTION

Figure 1:
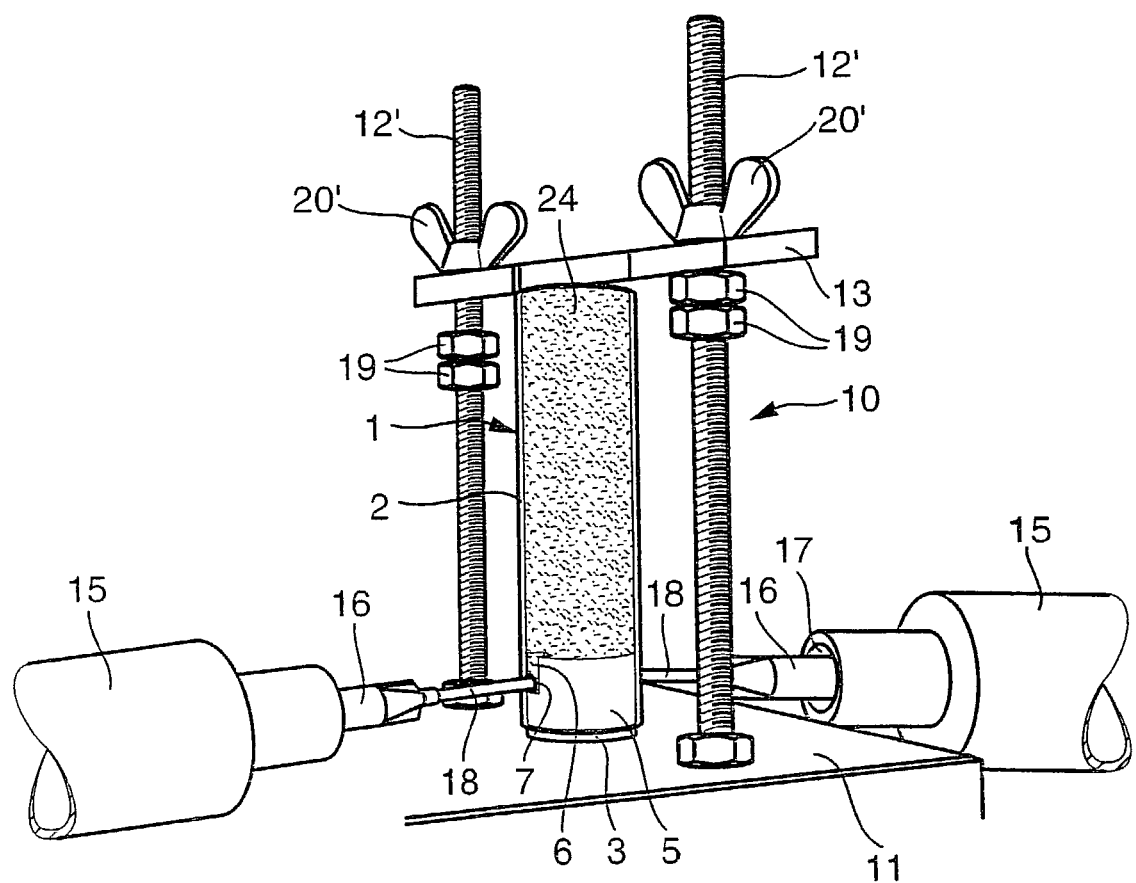
FIG. 1 shows in a perspective side view an example embodiment of the assembly according to the present invention, in which the component is a piezoelectric actuator, and an example embodiment of the device according to the present invention for filling casting gaps in the assembly through boreholes in the assembly housing, using a casting compound.
Figure 2:
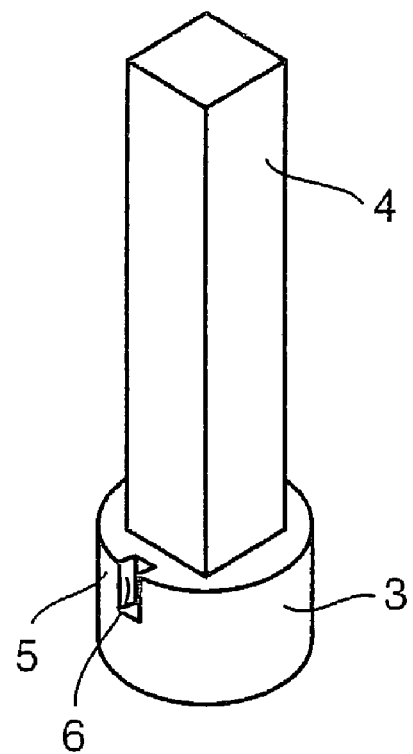
FIG. 2 shows, in a schematic perspective representation, details of the example embodiment of the assembly shown in FIG. 1.
Figure 3:
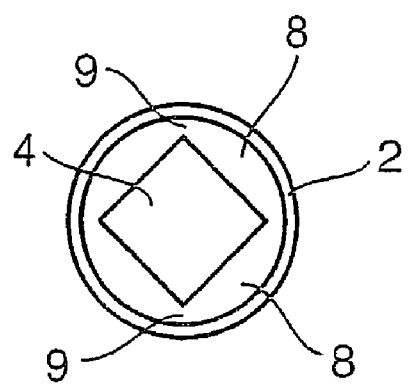
FIG. 3 shows in a schematic representation a cross section through the piezoelectric actuator and the housing of the example embodiment of the assembly shown in FIGS. 1, 4, and 5.

FIG. 1 shows an assembly 1, of which a sleeve 2 and a base 3 projecting from the sleeve are seen. The sleeve and the base form the housing for the component, which, as shown in FIG. 2, is a piezoelectric actuator 4 situated on base 3. The sleeve as well as the base are made of metal. In FIG. 1, however, the sleeve is made of a transparent material. It may be seen that the sleeve is filled with casting compound 24. Sleeve 2 is cylindrical and includes a circular cross section. One end of the sleeve is closed by end region 5 of base 3 which is inserted into the sleeve, at least the referenced end region is cylindrical and including a circular cross section and having an outer diameter approximately equal to the inner diameter of the housing, and two grooves 6 facing away from one another and running parallel to the longitudinal axis are introduced in the cylindrical surface of inserted end region 5 and ending on the end surface facing toward the interior of the housing. The sleeve wall includes two boreholes 7, of which only one is shown, which are positioned in such a manner that each borehole opens into one of the respective grooves when the base is appropriately positioned with respect to the sleeve (filling position). The piezoelectric actuator is situated on the referenced end surface of the base. The electrical lines by which the piezoelectric actuator receives electrical contact run in the grooves. The piezoelectric actuator forms a rectangular column. The longitudinal axis of the piezoelectric actuator coincides with the cylinder axes of the sleeve and the base. The diagonals through the cross section are somewhat (approximately 0.2 mm) shorter than the inner diameter of the housing. Thus, as shown in FIG. 3, the sleeve and the piezoelectric actuator are separated from one another by narrow, oblong casting gaps 8 which envelop the piezoelectric actuator, the maximum distances between the sleeve and the piezoelectric actuator is between approximately 1 mm and approximately 2 mm, the maximum distance is approximately 1.5 mm. The four narrowings 9 between the casting gaps are approximately 0.1 mm wide, i.e., approximately one order of magnitude smaller than the referenced maximum distances. The piezoelectric actuator has a maximum length such that its end facing away from the base together with the other end of the sleeve lie in a plane perpendicular to the longitudinal or cylinder axes. In the finished assembly, the other end of the sleeve is usually closed by a cover.

In order to fill casting gaps 8 with the casting compound, assembly 1 is clamped in a mounting which is part of a device 10. The mounting includes a base plate 11, two threaded rods 12', a tensioning bar 13, and nuts for the threaded rods. Base plate 11 includes an indentation into which the end of base 3 facing away from the housing may be inserted. On the straight line through the midpoint of the indentation, running parallel to the plate surface, threaded rods 12' are situated which are symmetrically spaced in relation to the midpoint of the indentation and perpendicular to the plate surface and which are anchored in the base plate. On each threaded rod are placed two adjusting nuts 19, tensioning bar 13 including matching holes whose distance from one another is equal to the distance between the threaded rods, and one wing nut 20'. The assembly which is inserted into the indentation may be clamped between the base plate and the tensioning bar, using the nuts, in such a manner that the longitudinal axis of the assembly is perpendicular to the plate, and, during filling, the open end of the assembly which forms the opening through which air may escape points upward. The casting compound is contained in two identical supply containers 15, included as part of the filling device, each of which is provided with an outlet 17 and a connection for a pressure generator, such as a compressor. On each of the outlets a nozzle 16 is placed which merges into a hollow needle 18 having an inner diameter of approximately 1.5 mm and which is inserted into one of boreholes 7 in the housing so as to fit closely against the hole wall. Alternatively, both nozzles may be supplied from one supply container.

As casting compounds which are applicable to all the described example embodiments, silicone-based resins, polyurethanes, and epoxides are used which are filled with at least one filler from the group including silicon dioxide, aluminum oxide, titanium dioxide, boron nitride, and aluminum nitride to improve the heat conductivity of the casting compound, the viscosity of the casting compound increasing with increasing proportions of filler. Viscosities for which the flowability at an appropriate casting pressure is sufficient and the heat conductivity is satisfactory have values between approximately 1500 mPas and approximately 50,000 mPas, e.g., between approximately 2000 mPas and approximately 30,000 mPas, which correspond— relative to the total weight of the casting compound—to filler contents between approximately 20% and approximately 90% by weight and between approximately 50% and approximately 80% by weight, respectively. For industrial applications, the minimum cross section of the hollow needle depends on the viscosity, within the described ranges, of the casting compound used in each individual case.

In order to fill casting gaps 8 in assembly 1, the casting compound stored in supply containers 15 is pressed out, under pressure, from the hollow needles into grooves 6, and from there reaches the casting gaps between the sleeve and the piezoelectric actuator and progressively fills these, while displacing air, up to the upper edge of the sleeve. Due to the pressure applied (casting pressure), which is between approximately 0.5 bar and approximately 10 bar, and e.g., is ≧approximately 3 bar, even casting compounds having medium and relatively high viscosity are conveyed from the two oppositely situated casting gaps into which the grooves open, through narrowings 9 into the two other casting gaps, so that the surface area of the casting compound in the casting gaps increases uniformly. Base 3 and sleeve 2 are then displaced sufficiently with respect to one another, i.e., rotated with respect to one another about the common axis, so that boreholes 7 are no longer situated opposite grooves 6, but instead are situated opposite regions in the cylindrical surface of the base, with the result that the casting compound filled inside is not able to flow back when hollow needles 18 are pulled from boreholes 7. The casting compound filled inside is crosslinked, e.g., by adding heat. The base is firmly connected to the sleeve, e.g., by welding, and the end of the sleeve facing away from the base is usually closed tightly by a cover. This may occur before or after the crosslinking.

Alternatively, a hardener may be added to the casting compound before it is used in filling (two-component system). An additional supply container or supply containers are provided for the hardener. In this case, both components are combined in a combination set connected upstream from nozzles 17.

Figure 4:
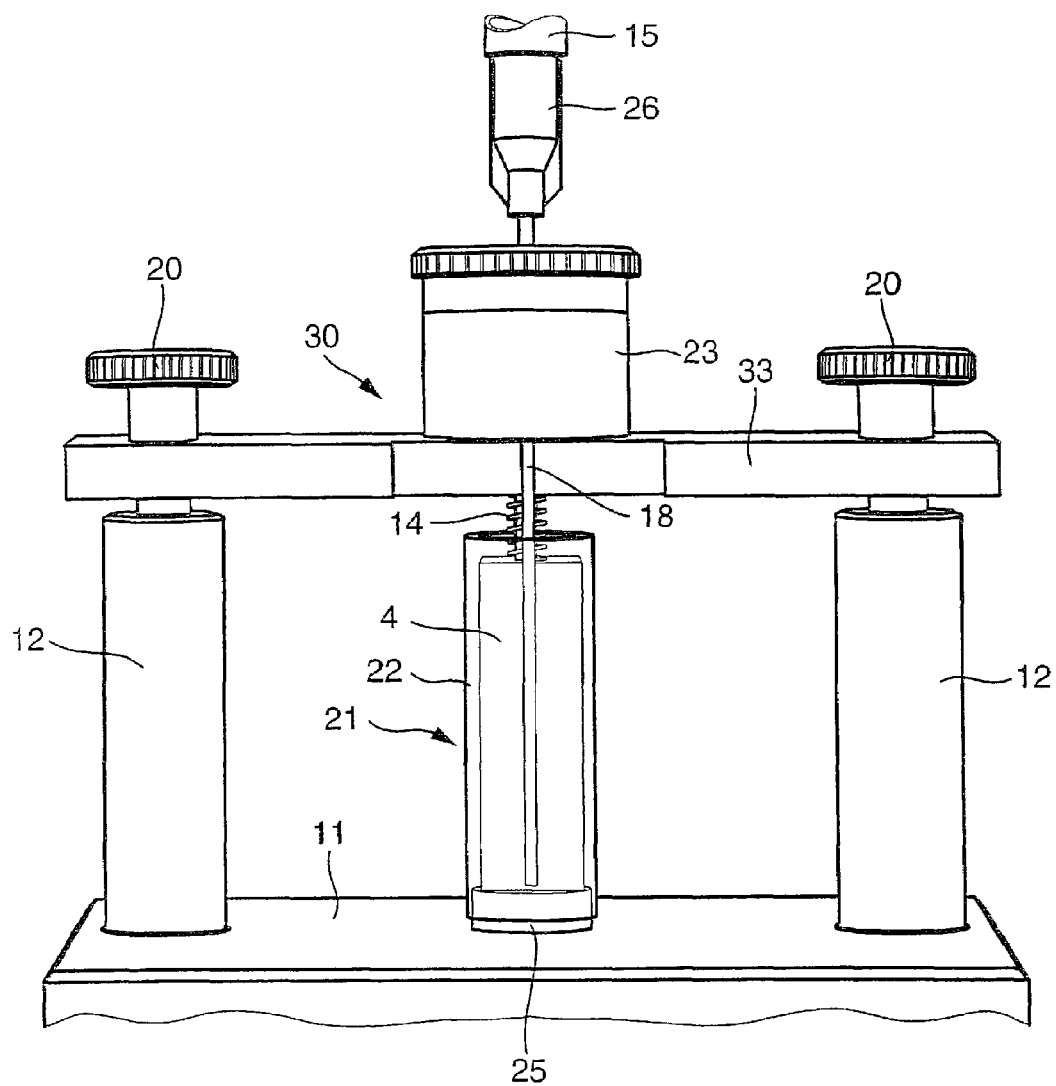
FIG. 4 shows in a perspective side view a further example embodiment of the assembly according to the present invention in which the component is a piezoelectric actuator, and a partial detail of a further example embodiment of the device according to the present invention for filling casting gaps in the assembly with a casting compound using hollow needles which are introduced into the gap through an opening in the housing.
Figure 5:
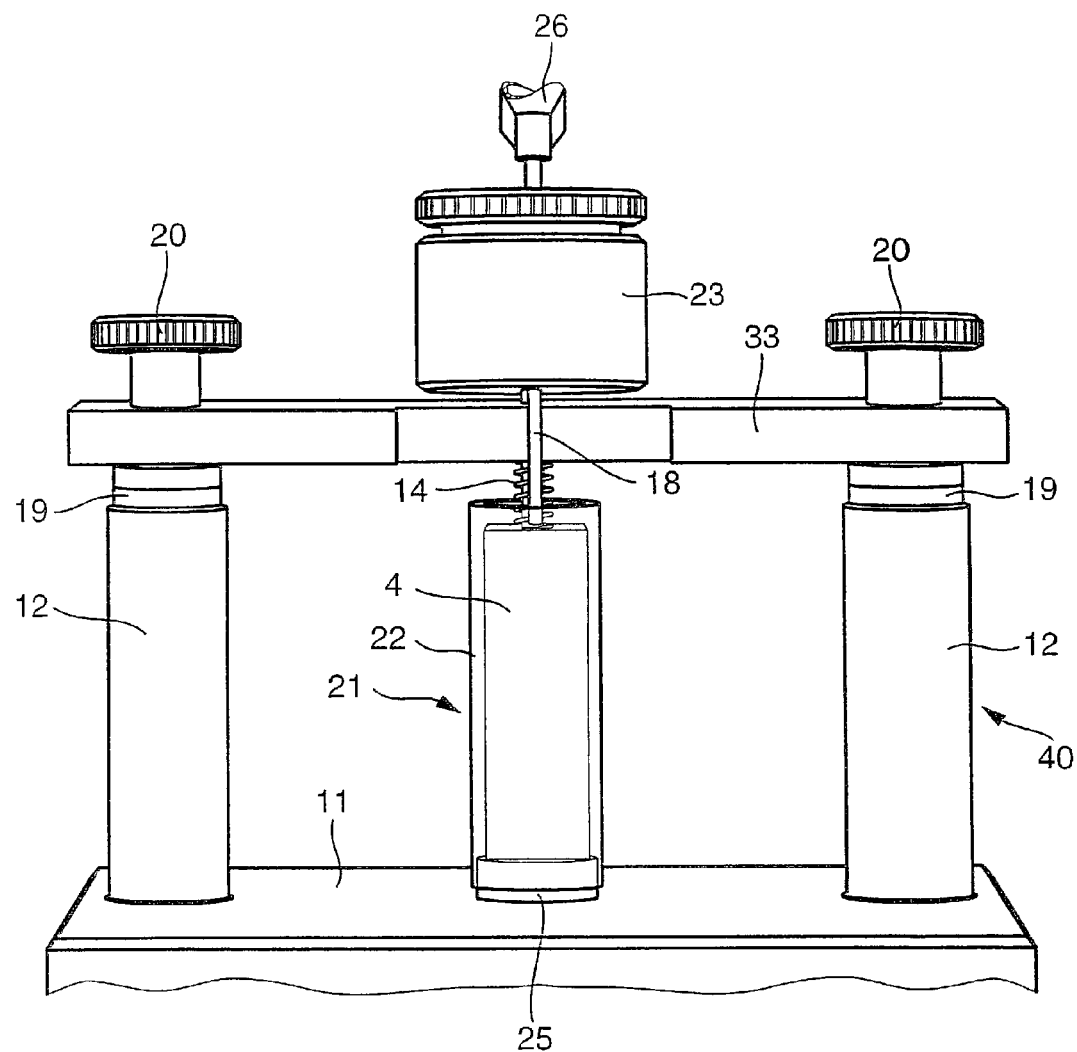
FIG. 5 shows in a perspective side view the assembly shown in FIG. 4, and a partial detail of yet a further example embodiment of the device according to the present invention which is similar to that shown in FIG. 4.

Assembly 21 shown in FIGS. 4 and 5 differs from assembly 1 shown in FIGS. 1 and 2 in that sleeve 22, unlike sleeve 2, includes no boreholes 7, and that the grooves introduced into base 25, optionally for the power supply, are not configured as a transport path for the casting compound, unlike the case for base 3. In the assembly shown in FIGS. 4 and 5, which has not yet been filled with casting compound, piezoelectric actuator 4 is visible through sleeve 2.

Casting gaps 8 in assembly 21 are filled via two hollow needles 18 which are inserted from the end of sleeve 22 facing away from the base—which in this stage of the method is open —into the housing in such a manner that the hollow needles open into two oppositely situated casting gaps. To perform filling, the assembly is clamped into device 30 shown in FIG. 4 or in device 40 shown in FIG. 5.

Assembly 21 is clamped into a mounting in device 30. The mounting includes base plate 11, two rods 12, tensioning bar 33, and nuts. Base plate 11 includes an indentation into which the end of base 25 facing away from the housing may be inserted. On the straight line through the midpoint of the indentation, running parallel to the plate surface, are situated rods 12 which are symmetrically spaced in relation to the midpoint of the indentation and perpendicular to the plate surface and which are anchored in the base plate. On their ends facing away from the base plate, rods 12 include a thread having a diameter which is smaller than the diameter of the lower portion of rods 12. Tensioning bar 33, together with holes which fit the thread and whose midpoints are separated by a distance which is equal to the distance between the midpoints of rods 12, and knurled nut 20 are placed on each of the rods. The assembly which is inserted into the indentation may be clamped between the base plate and the tensioning bar using the nuts, e.g., by placing a pressure spring 14 between the upper end of the sleeve and the tensioning bar, in such a manner that the longitudinal axis of the assembly is perpendicular to the base plate, and its end, which is open during filling, points upward. Above the tensioning bar, but not firmly connected to it, a nozzle holder 23 is arranged which is penetrated by a nozzle-like reducing fitting 26. The reducing fitting is situated with its upper end at the discharge of a supply container 15, or alternatively is connected to a mixer, provided that the resin component of the casting compound forms a two-component system (see above). The supply container(s) is (are) each provided with a pressure generator, such as a compressor. The reducing fitting is connected at its lower end to a distributor inside the nozzle holder. The distributor includes two outlets, on each of which is situated a nozzle. Hollow needles 18 are placed on each of the nozzles, and project downward from the nozzle holder and are aligned with guide sleeves which run parallel to one another and which are integrated into the tensioning bar as guide aids for the hollow needles. To enable the hollow needles to align with the guide sleeves, the distance between the midpoints of the nozzles and thus of the hollow needles is the same as the distance between the midpoints of the guide sleeves, and the hollow needles run parallel to the longitudinal axes of the guide sleeves. The guide sleeves are positioned with relation to the clamped assembly in such a manner that their longitudinal axis runs parallel to the cylinder axis of sleeve 22, and that the hollow needles led into the guide sleeves may be held in two oppositely situated casting gaps 8 in assembly 21, where the distance between the sleeve and the piezoelectric actuator is greatest (approximately 1.5 mm) approximately midway between sleeve 22 and piezoelectric actuator 4, without contacting the piezoelectric actuator. The hollow needles may include a circular cross section. Alternatively, the cross section of the hollow needles may be adapted to the cross section of the casting gaps, such as a sector of a circle or perhaps only an ellipse, for example, so that the cross sections are then appropriately aligned with one another. The nozzle holder is attached to a lifting device by which the nozzle holder together with the supply container may be moved vertically, either manually or by sensor control and motor drive.

The above description regarding the filling of the casting gaps in assembly 1 applies to the casting compound which is to be filled into the casting gaps of assembly 21.

To fill the casting gaps in assembly 21 with casting compound using mounting 30, first the nozzle holder is lowered so that the hollow needles of appropriate length are inserted far enough into the casting gaps that the ends of the hollow needles are situated just above base 25. As casting compound flows in, the ends of the needles are gradually pulled out as the level of casting compound rises, so that the hollow needles are never submerged, but instead end just above the surface of the casting compound being filled inside. The casting compound is under pressure (casting pressure) as it leaves the hollow needle. Supported by this pressure, the casting compound—even when it has a relatively high viscosity—flows completely over narrowings 9 between the sleeve and the piezoelectric actuator and also flows into the casting gaps into which hollow needles are not inserted, with the result that the surface level of the casting compound rises uniformly in the entire cavity. Withdrawal of the hollow needles and lifting of the nozzle holder may be accomplished manually, corresponding to the visually observed level, or—as preferred for industrial manufacturing—using a sensor—controlled motor drive. The filling operation is complete when the casting gaps have been filled up to the open end of the housing. Also, the base and sleeve of assembly 21 may be firmly connected to one another before the filling operation.

After the casting gaps are filled, the casting compound is crosslinked by heating, and the end of the sleeve facing away from the base is tightly closed by a cover.

Device 40 shown in FIG. 5 may also be used in filling of assembly 21. The hollow needles which open into the casting gaps do not dip into the casting gaps, as described above, but instead their ends are fixed at the upper end of the casting gaps, and during filling, the hollow needles are not lifted corresponding to the filling rate. As a result, device 40 differs from mounting 30 by the fact that two adjusting nuts 19 are present on the thread at the end of each rod 12 underneath tensioning bar 33 which allow the distance between the base plate and the tensioning bar to vary, and by the fact that nozzle holder 23 is connected to the tensioning bar and there is no lifting device for the nozzle holder, and by the fact that, over the adjustable distances between the base plate and the tensioning bar, the hollow needles are only long enough so that the needle ends may be fixed at the upper end of the casting gaps. The hollow needles are thus aligned with the casting gaps in the same manner as described above in conjunction with device 30.

After assembly 21, as it has been described with reference to FIG. 4, has been clamped into device 40, in order to fill the casting gaps with casting compound, the needle ends which are at the same height as the upper end of the piezoelectric actuator are positioned by using adjusting nuts 19 to correspondingly lower or raise the tensioning bar. Filling is then performed in such a manner that casting compound is allowed to flow into the casting gaps until the level is approximately the same height as the needle ends. In this case, there is no use in having the casting compound flow into the casting gaps under pressure. Moreover, in this alternative the casting compound may only be conveyed through the narrowings between the casting gaps when the viscosity of the casting compound is relatively low, i.e., $\leq$approximately 1500 mPas.

The present invention is described in more detail hereinafter with reference to two examples.

EXAMPLE 1

Assembly 1 was clamped into the mounting included in device 10. The casting compound was filled at a pressure of $\geq$6 bar through boreholes 7 in the housing and through grooves 6 into the casting gaps between the housing and the piezoelectric actuator. The casting compound was a silicone resin filled with aluminum oxide, having a viscosity of 30,000 mPas. The aluminum oxide content relative to the total weight of the casting compound was approximately 70% by weight. The approximately 1.5 g of casting compound required for complete filling was introduced within $\leq$3 seconds. The sleeve and the base were then rotated with respect to one another to interrupt the connection between the boreholes and the casting gaps. The crosslinked casting compound had a heat conductivity of 1.2 watt/m° K.

EXAMPLE 2

Assembly 21 was clamped into the mounting included in device 30. The casting compound was pressed at a pressure of $\geq$6 bar into the casting gaps between the housing and the piezoelectric actuator, using hollow needles, and the hollow needles were pulled upward as the filling progressed. The casting compound was a silicone resin filled with quartz, having a viscosity of 2000 mPas. The quartz content relative to the total weight of the casting compound was approximately 60% by weight. The approximately 1.5 g of casting compound required for complete filling was introduced within $\leq$3 seconds. The cured compound had a heat conductivity of 0.8 watt/m° K

What is claimed is:

1. An assembly, comprising:
   a component; and
   a housing enclosing the component, a region of the component being attached to the housing and the attached region being separated from other regions of the component by a plurality of casting gaps filled with a crosslinked casting compound containing a filler,
   wherein:
   distances across the plurality of casting gaps between the housing and the component are approximately $\leq$3 mm, and the crosslinked casting compound includes a high filler content,
   the housing includes a base and a tubular sleeve that surrounds the component, the base being attached to the component and the tubular sleeve,
   the base is placed in an end of the tubular sleeve, an inserted end region of the base including a cross section which is matched to a tubular cross section so that the inserted end region fits closely against an interior of the tubular sleeve, at least one continuous borehole is included in the end of the tubular sleeve in which the base is placed, the inserted end region of the base provides for the at least one continuous borehole a transport path for a free-flowing medium between a surface region of the base facing toward an inner wall of the tubular sleeve and an end of the base facing toward the interior of the tubular sleeve, and the tubular sleeve and the base are brought together in a position such that the at least one continuous borehole is connected to the transport path associated therewith.

2. The assembly according to claim 1, wherein:
the distances across the plurality of casting gaps and the filler content of the crosslinked casting compound are adjusted to one another with regard to a predetermined heat dissipation.

3. The assembly according to claim 1, wherein:
the filler content relative to a total weight of the crosslinked casting compound is between 20% and 90% by weight.

4. The assembly according to claim 3, wherein:
the filler content is between 50% and 80% by weight.

5. The assembly according to claim 1, wherein:
the housing is made of a metal.

6. The assembly according to claim 1, wherein:
the component is attached to an end of the inserted end region that faces toward the interior of the tubular sleeve.

7. The assembly according to claim 1, wherein:
the tubular sleeve is a hollow cylinder, and at least the inserted end region of the base is a cylinder block.

8. The assembly according to claim 7, wherein:
each of the hollow cylinder and the cylinder block includes a circular cross section.

9. The assembly according to claim 7, wherein:
the component has an oblong shape.

10. The assembly according to claim 9, wherein:
a longitudinal axis of the component extends parallel to at least one axis of the hollow cylinder and the cylinder block.

11. The assembly according to claim 10, wherein:
the longitudinal axis coincides with the at least one axis of the hollow cylinder and the cylinder block.

12. The assembly according to claim 9, wherein:
the component is a cuboid.

13. The assembly according to claim 12, wherein:
the cuboid is a rectangular column.

14. The assembly according to claim 1, wherein:
the crosslinked casting compound is elastic.

15. The assembly according to claim 14, wherein:
the component is an actuator.

16. The assembly according to claim 15, wherein:
the actuator is a piezoelectric actuator.

17. The assembly according to claim 1, wherein:
a smallest dimension across the plurality of casting gaps between the tubular sleeve and the component is between 0.05 mm and 0.2 mm, and a largest dimension is between 1.4 mm and 2.6 mm.

18. The assembly according to claim 17, wherein:
the smallest dimension is 0.1 mm and the largest dimension is 1.5 mm.

19. The assembly according to claim 1, wherein:
the transport path is formed by a groove introduced into the surface region facing toward the inner wall of the tubular sleeve, the groove beginning where the at least one continuous borehole meets the base, extending parallel to an axis of the tubular sleeve and opening into a space between the component and the tubular sleeve.

20. The assembly according to claim 1, wherein:
the crosslinked casting compound includes at least one resin based on a silicone, a polyurethane, and an epoxide.

21. The assembly according to claim 1, wherein:
the filler includes one of a silicon dioxide, an aluminum oxide, a titanium dioxide, a boron nitride, an aluminum nitride, and a mixture including at least two of the silicon dioxide, the aluminum oxide, the titanium dioxide, the boron nitride, and the aluminum nitride.

22. The assembly according to claim 1, wherein:
the tubular sleeve is firmly connected to the base.

23. The assembly according to claim 1, further comprising:
a cover for covering an end of the tubular sleeve facing away from the base.

* * * * *